(12) United States Patent
Yang et al.

(10) Patent No.: US 10,763,210 B2
(45) Date of Patent: Sep. 1, 2020

(54) CIRCULAR RING SHAPED ANTIFUSE DEVICE

(71) Applicant: International Business Machines Corporation, Armonk, NY (US)

(72) Inventors: Chih-Chao Yang, Glenmont, NY (US); Baozhen Li, South Burlington, VT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 16/239,162

(22) Filed: Jan. 3, 2019

(65) Prior Publication Data
US 2020/0219811 A1 Jul. 9, 2020

(51) Int. Cl.
*H01L 23/525* (2006.01)
*H01L 21/74* (2006.01)

(52) U.S. Cl.
CPC ........ *H01L 23/5252* (2013.01); *H01L 21/743* (2013.01)

(58) Field of Classification Search
None
See application file for complete search history.

(56) References Cited

U.S. PATENT DOCUMENTS

| | | | |
|---|---|---|---|
| 5,789,795 A | 8/1998 | Sanchez et al. | |
| 5,986,322 A * | 11/1999 | McCollum | ........ H01L 23/5252 257/530 |
| 6,124,194 A | 9/2000 | Shao et al. | |
| 6,251,710 B1 | 6/2001 | Radens et al. | |
| 6,335,228 B1 | 1/2002 | Fuller et al. | |
| 6,603,142 B1 * | 8/2003 | Ranaweera | ........ H01L 23/5252 257/50 |
| 7,825,479 B2 * | 11/2010 | Booth, Jr. | ........... H01L 23/5252 257/395 |
| 8,004,060 B2 | 8/2011 | Kim et al. | |
| 9,514,905 B2 | 12/2016 | Redaelli et al. | |
| 9,741,657 B2 | 8/2017 | Filippi et al. | |
| 2006/0214261 A1 | 9/2006 | You et al. | |
| 2007/0236237 A1 * | 10/2007 | Kuo | ........................ H01L 22/14 324/762.01 |
| 2009/0224324 A1 * | 9/2009 | Nakamura | ........... H01L 23/5252 257/355 |
| 2017/0244055 A1 * | 8/2017 | Bangsaruntip | .... H01L 29/42376 |

OTHER PUBLICATIONS

Rizzolo, R.F., et al., "IBM System z9 eFUSE applications and methodology", IBM J. Res. & Dev., Jan./Mar. 2007, pp. 65-75, vol. 51 No. ½.

* cited by examiner

*Primary Examiner* — Ali Naraghi
(74) *Attorney, Agent, or Firm* — Scully, Scott, Murphy & Presser, P.C.; Alvin Borromeo, Esq.

(57) ABSTRACT

An antifuse structure having enhanced programming efficiency is provided in which there is limited contact between the antifuse material and top and bottom electrodes. The antifuse material has a circular ring shape (i.e., donate shape having a hole in the middle (center) thereof) in which a dielectric material structure composed of a dielectric material having a dielectric constant of great than 4.0 is contained in the hole of the circular ring shaped antifuse material. The antifuse material is composed of a dielectric material having a lower dielectric breakdown strength as compared to the dielectric material structure.

11 Claims, 4 Drawing Sheets

CIRCULAR RING SHAPED ANTIFUSE DEVICE

BACKGROUND

The present application relates to an antifuse structure and a method of forming the same. More particularly, the present application relates to an antifuse structure having enhanced programming efficiency and a method of forming the same.

Antifuse structures have been used in the semiconductor industry for memory related applications including, for example, field programmable gate arrays and programmable read-only memories. Prior art antifuse structures include a continuous layer of an antifuse material that is sandwiched between two disconnected conductive materials (i.e., a top electrode and a bottom electrode). The antifuse material initially has a high resistance, but it can be converted into a lower resistance by the application of a certain process. For example, and after high voltage programming, the antifuse structure/circuit becomes conductive/open through a dielectric breakdown phenomenon.

In such prior art antifuse structures, programming efficiency is a concern due to the large contact area that exists between the layer of antifuse material and the two electrodes. There is a need for providing an anitfuse structure in which the contact area between the antifuse material and the two electrodes is reduced which, in turn, can lead to improved programming efficiency.

SUMMARY

An antifuse structure having enhanced programming efficiency is provided in which there is limited contact between the antifuse material and top and bottom electrodes. The antifuse material (i.e., antifuse element) has a circular ring shape (i.e., cylindrical or donate shape having a hole in the middle (center) thereof) in which a dielectric material structure composed of a dielectric material having a dielectric constant of great than 4.0 is contained in the hole of the circular ring shaped antifuse material. The antifuse material is composed of a dielectric material having a lower dielectric breakdown strength as compared to the dielectric material structure.

In one aspect of the present application, an antifuse structure that has enhanced programming efficiency is provided. In one embodiment of the present application, the antifuse structure includes a dielectric material structure composed of a dielectric material having a dielectric constant of greater than 4.0 located on a surface of a first electrode. An antifuse element having a circular ring shape laterally surrounds, and directly contacts, the dielectric material structure. A second electrode is located on an entirety of the dielectric material structure and partially located on the antifuse material.

In another aspect of the present application, a method of forming an antifuse structure having enhanced programming efficiency is provided. In one embodiment of the present application, the method includes providing a dielectric material structure composed of a dielectric material having a dielectric constant of greater than 4.0 on a surface of a first electrode. An antifuse element having a circular ring shape is formed laterally surrounding, and directly contacting, the dielectric material structure. Next, a second electrode is formed covering an entirety of the dielectric material structure and partially extending onto the antifuse material.

DETAILED DESCRIPTION

Figure 1:
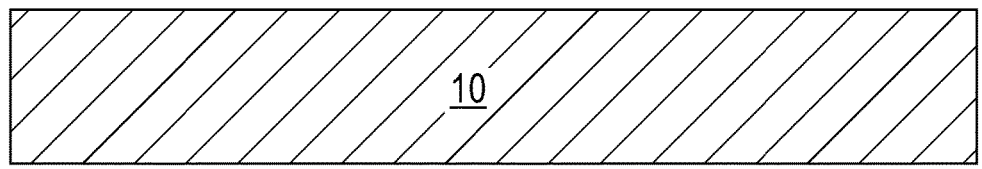
FIG. 1 is a cross sectional view of an exemplary antifuse structure of the present application during an early stage of fabrication and including a first electrode.

The present application will now be described in greater detail by referring to the following discussion and drawings that accompany the present application. It is noted that the drawings of the present application are provided for illustrative purposes only and, as such, the drawings are not drawn to scale. It is also noted that like and corresponding elements are referred to by like reference numerals.

In the following description, numerous specific details are set forth, such as particular structures, components, materials, dimensions, processing steps and techniques, in order to provide an understanding of the various embodiments of the present application. However, it will be appreciated by one of ordinary skill in the art that the various embodiments of the present application may be practiced without these specific details. In other instances, well-known structures or processing steps have not been described in detail in order to avoid obscuring the present application.

It will be understood that when an element as a layer, region or substrate is referred to as being "on" or "over" another element, it can be directly on the other element or intervening elements may also be present. In contrast, when an element is referred to as being "directly on" or "directly over" another element, there are no intervening elements present. It will also be understood that when an element is referred to as being "beneath" or "under" another element, it can be directly beneath or under the other element, or intervening elements may be present. In contrast, when an element is referred to as being "directly beneath" or "directly under" another element, there are no intervening elements present.

Referring first to FIG. 1, there is illustrated an exemplary antifuse structure of the present application during an early stage of fabrication and including a first electrode 10. The first electrode 10 may be present on a surface of a substrate (not shown). In one embodiment, the substrate is a semiconductor material that has semiconducting properties and which contains one or more semiconductor devices such as, for example, transistors, formed thereon. In another embodiment, the substrate is an interconnect level including an interconnect dielectric material that contains one or more electrically conductive structures embedded thereon. In such an embodiment, the interconnect level is located above a semiconductor material having semiconducting properties and containing one or more semiconductor devices formed thereon.

Notwithstanding the type of substrate employed, the first electrode 10 is composed of an electrically conductive metal or metal alloy. Examples of electrically conductive metals that may be employed as the first electrode 10 include, but are not limited to, copper (Cu), aluminum (Al), tungsten (W), cobalt (Co), ruthenium (Ru), tantalum (Ta), or titanium (Ti). Examples of electrically conductive metals that may be employed as the first electrode 10 include, but are not limited to, any combination of the above mentioned metals (i.e., a Cu—Al alloy) or any above mentioned metals in a nitride form (i.e., TaN, TiN, or WN).

The electrically conductive metal or metal alloy that provides the first electrode 10 can be formed utilizing a deposition process such as, for example, chemical vapor deposition (CVD), plasma enhanced chemical vapor deposition (PECVD), sputtering, chemical solution deposition or plating. The first electrode 10 may have a thickness from 10 nm to 200 nm; although other thicknesses are possible and can be used as the thickness of the first electrode 10.

In some embodiments, the blanket layer of the electrically conductive metal or metal alloy itself provides the first electrode 10. In other embodiments, the blanket layer of the electrically conductive metal or metal alloy is patterned by lithography and etching to provide the first electrode 10. In such an embodiment (not shown), a dielectric material (not shown) can be formed so as to laterally surround the patterned first electrode 10.

Figure 2:
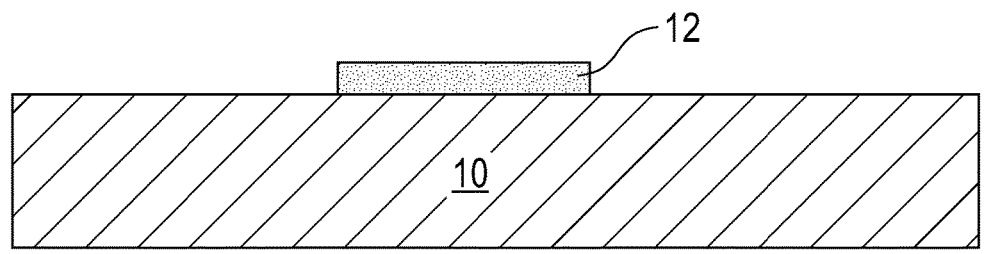
FIG. 2 is a cross sectional view of the exemplary antifuse structure of FIG. 1 after forming a dielectric material structure composed of a dielectric material having a dielectric constant of greater than 4.0 on a surface of the first electrode.

Referring now to FIG. 2, there is illustrated the exemplary antifuse structure of FIG. 1 after forming a dielectric material structure 12 on a surface of the first electrode 10. The dielectric material structure 12 is spherical in shape; this is clearly seen in the top down view of the exemplary antifuse structure shown in FIG. 3B. By "spherical" it is meant a material or structure has a shape of a solid circle with an outer sidewall.

The dielectric material structure 12 is composed of a dielectric material that has a dielectric constant of greater than 4.0; all dielectric constants mentioned herein are relative to a vacuum unless otherwise stated. Exemplary dielectric materials having a dielectric constant of greater than 4.0 (i.e., a high-k dielectric material) that can be employed in providing the dielectric material structure 12 include, but are not limited to, $HfO_2$, $ZrO_2$, $La_2O_3$, $Al_2O_3$, $TiO_2$, $SrTiO_3$, $LaAlO_3$, $Y_2O_3$, $HfO_xN_y$, $ZrO_xN_y$, $La_2O_xN_y$, $Al_2O_xN_y$, $TiO_xN_y$, $SrTiO_xN_y$, $LaAlO_xN_y$, $Y_2O_xN_y$, $SiON$, $SiN_x$, a silicate thereof, and an alloy thereof. Each value of x is independently from 0.5 to 3 and each value of y is independently from 0 to 2. In some embodiments, a single high-k dielectric material is used in providing the dielectric material structure 12. In other embodiments, a stack including at least two high-k dielectric materials can be used in providing the dielectric material structure 12.

The dielectric material structure 12 is formed by first depositing a blanket layer of the high-k dielectric material(s) on the surface of the first electrode 10, and thereafter patterning the blanket layer by lithography and etching. Exemplary deposition processes that can be used in forming the blanket layer of the high-k dielectric material(s) include, but are not limited to, CVD, PECVD, physical vapor deposition (PVD) or atomic layer deposition (ALD). The dielectric material structure 12 may have a thickness from 5 nm to 50 nm; although other thicknesses are possible and can be used as the thickness of dielectric material structure 12. The dielectric material structure 12 may have a diameter of from 5 Å to 50 nm; although diameters are possible and thus can be used as the diameter of the dielectric material structure 12.

Figure 3A:
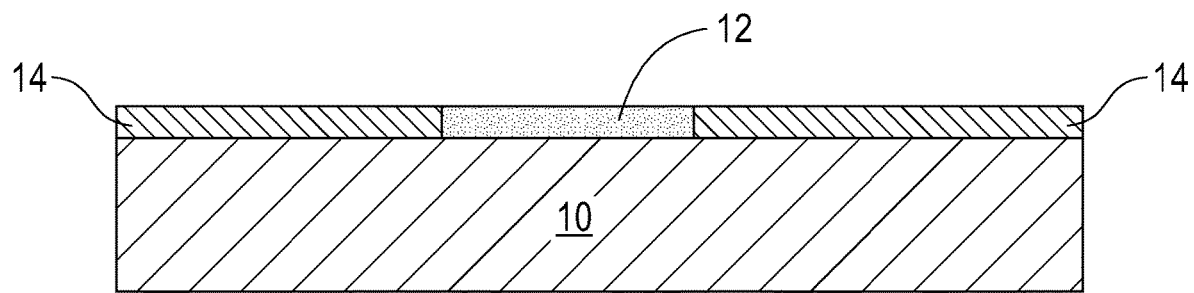
FIG. 3A is a cross sectional view of the exemplary antifuse structure of FIG. 2 after forming an antifuse element having a circular ring shape laterally surrounding the dielectric material structure and on a physically exposed surface of the first electrode.
Figure 3B:
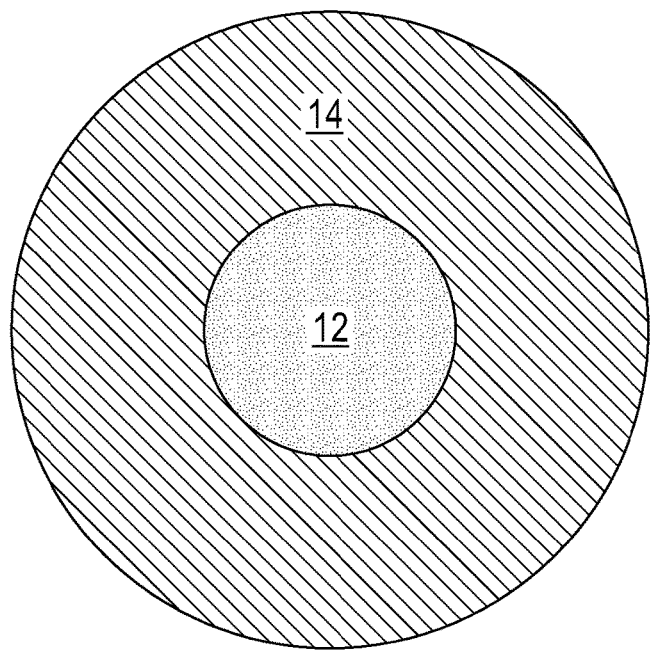
FIG. 3B is a top down view of the exemplary antifuse structure shown in FIG. 3A.

Referring now to FIGS. 3A-3B, there are shown the exemplary antifuse structure of FIG. 2 after forming an antifuse element 14 having a circular ring shape laterally surrounding the dielectric material structure 12 and on a physically exposed surface of the first electrode 10. By "ring-shape" it is meant a structure or material that has a shape of a cylinder or donut including a circular outermost sidewall and a circular innermost sidewall and having a hole present therein. In accordance with the present application, the hole of the ring shaped antifuse element 14 contains the dielectric material structure 12.

The antifuse element 14 is composed of a dielectric material that has a lower dielectric breakdown strength than dielectric material that provides the dielectric material structure 12. Notably, the dielectric material that provides the antifuse element 14 has a dielectric constant of 3.5 or less; such dielectric materials may be referred to herein as a low-k dielectric material. Exemplary low-k dielectric materials that can be employed as the antifuse element 14 include, but are not limited to, a dielectric material including atoms of silicon, carbon and hydrogen, a dielectric material including atoms of silicon, carbon, hydrogen and oxygen, or a dielectric material including atoms of silicon, carbon, hydrogen and nitrogen. In one example, the low-k dielectric material that provides the antifuse element 14 may be composed of an nBLOK dielectric material that contains atoms of silicon, carbon, hydrogen, nitrogen and oxygen. In some embodiments, a single low-k dielectric material is used in providing the antifuse element 14. In other embodiments, a stack including at least two low-k dielectric materials can be used in providing the antifuse element 14.

The antifuse element 14 may be formed utilizing a deposition such as, for example, CVD, PECVD or spin-on coating. In one example, a CVD process performed at a temperature of 550° C. or less can be employed in providing the antifuse element 14. In some embodiments, and following the deposition process, the deposited dielectric material having the low breakdown strength may be subjected to a planarization process such as, for example, chemical mechanical polishing (CMP) and/or grinding, so as to provide an antifuse element 14 that has a topmost surface that is coplanar with a topmost surface of the dielectric material structure 12. Thus, the antifuse element 14 and the dielectric material structure 12 have a same thickness. In some embodiments, a patterning process (i.e., lithography and etching) can be used to provide the final antifuse element 14. As is shown, the dielectric material structure 12 is laterally surround by the antifuse element 14, and the outer sidewall of the dielectric material structure 12 is in direct physical contact with the innermost sidewall of the antifuse element 14.

Figure 4:
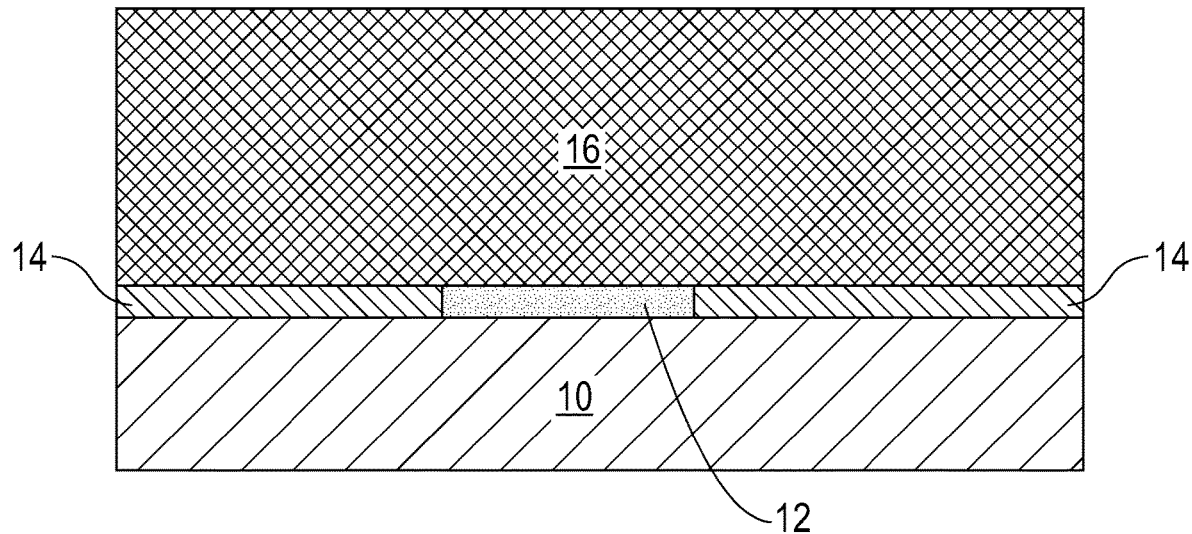
FIG. 4 is a cross sectional view of the exemplary antifuse structure of FIGS. 3A-3B after forming an interconnect dielectric material on the antifuse element and the dielectric material structure.

Referring now to FIG. 4, there is illustrated the exemplary antifuse structure of FIGS. 3A-3B after forming an interconnect dielectric material 16 on the antifuse element 14 and the dielectric material structure 12. The interconnect dielectric material 16 is composed of an inorganic dielectric material or an organic dielectric material which is compositionally different from the antifuse element 14 and the dielectric material structure 12. In some embodiments, the interconnect dielectric material 16 may be porous. In other embodiments, the interconnect dielectric material 16 may be non-porous. Examples of suitable dielectric materials that may be employed as the interconnect dielectric material 16 include, but are limited to, silicon dioxide, undoped or doped silicate glass, silsesquioxanes, C doped oxides (i.e., organosilicates) that include atoms of Si, C, O and H, theremosetting polyarylene ethers or any multilayered combination thereof. The term "polyarylene" is used in this present application to denote aryl moieties or inertly substituted aryl moieties which are linked together by bonds, fused rings, or inert linking groups such as, for example, oxygen, sulfur, sulfone, sulfoxide, or carbonyl.

In some embodiments, the interconnect dielectric material 16 may have a dielectric constant of about 4.0 or less. In one example, the interconnect dielectric material 16 can have a dielectric constant of 2.8 or less. These dielectrics generally having a lower parasitic cross talk as compared to dielectric materials whose dielectric constant is greater than 4.0.

The interconnect dielectric material 16 can be formed by a deposition process such as, for example, CVD, PECVD or spin-on coating. The interconnect dielectric material 16 can have a thickness from 50 nm to 250 nm. Other thicknesses that are lesser than 50 nm, and greater than 250 nm can also be employed in the present application as the thickness of the interconnect dielectric material 16.

Figure 5A:
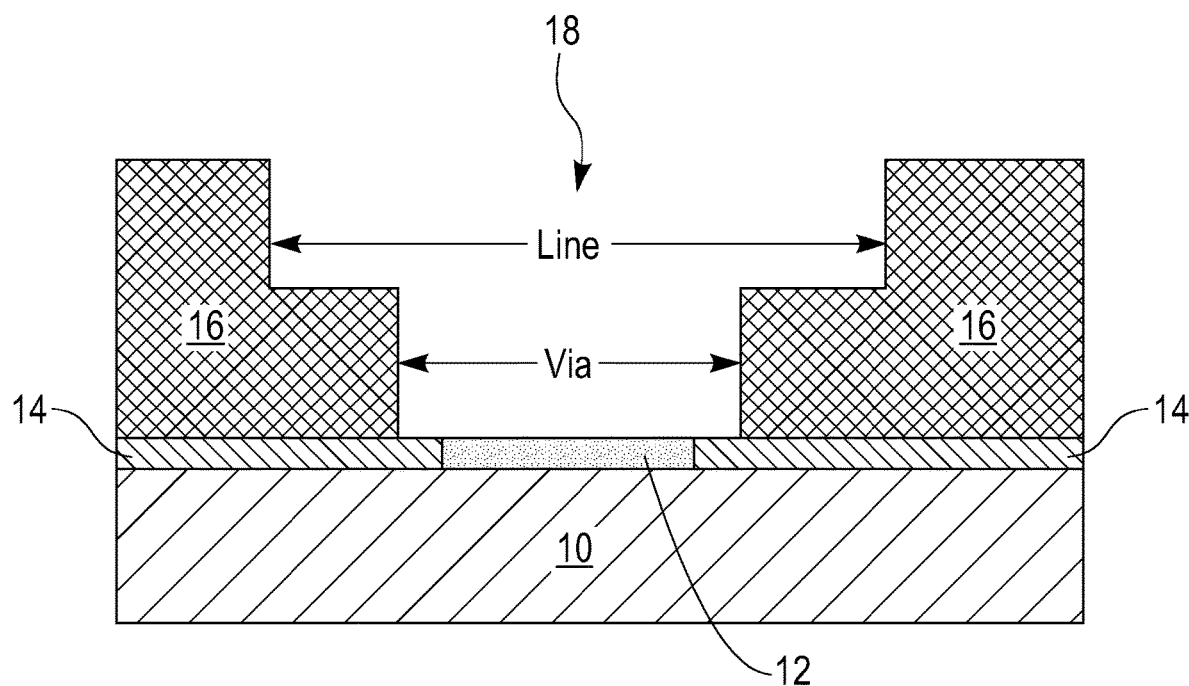
FIG. 5A is a cross sectional view of the exemplary antifuse structure of FIG. 4 after forming an opening having a lower via portion and an upper line portion in the interconnect dielectric material in accordance with an embodiment of the present application.

Referring now to FIG. 5A, there is illustrated the exemplary antifuse structure of FIG. 4 after forming an opening 18 having a lower via portion (via) and an upper line portion (line) in the interconnect dielectric material 16 in accordance with an embodiment of the present application. Opening 18 physically exposes the entirety of the dielectric material structure 12 and only a portion of the antifuse element 14 that is located laterally adjacent to the dielectric material structure 14; a majority of the antifuse element 14 (e.g., from 80% to 99.9%) remains covered by the interconnect dielectric material 16. The physically exposed portion of the antifuse element 14 may extend from 0.1 nm to 5 nm outward from the innermost sidewall of the antifuse element 14 that is in direct physical contact with the outer sidewall of the dielectric material structure 12.

The opening 18 is formed utilizing two iterations of lithography and etching. As is shown, the line portion of the opening 18 has a width that is greater than a width of the via portion of the opening. In one example, the width of the via portion of the opening 18 is from 10 nm to 600 nm, while the width of the line portion of the opening 18 is from 10 nm to 1500 nm.

Figure 5B:
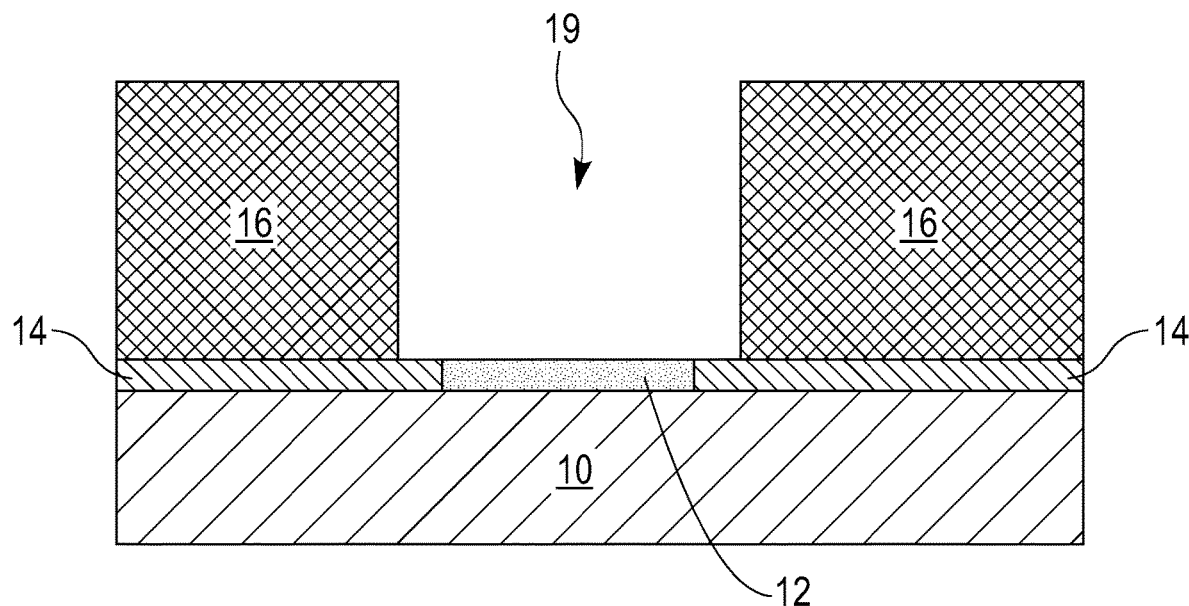
FIG. 5B is a cross sectional view of the exemplary antifuse structure of FIG. 4 after forming an opening in the interconnect dielectric material in accordance with another embodiment of the present application.

Referring now to FIG. 5B, there is illustrated the exemplary antifuse structure of FIG. 4 after forming an opening 19 in the interconnect dielectric material 16 in accordance with another embodiment of the present application. In this embodiment, opening 19 may be a via opening or a line opening. Opening 19 physically exposes the entirety of the dielectric material structure 12 and only a portion of the antifuse element 14 that is located laterally adjacent to the dielectric material structure 14; a majority of the antifuse element 14 (e.g., from 80% to 99.9%) remains covered by the interconnect dielectric material 16. The physically exposed portion of the antifuse element 14 may extend from 0.1 nm to 5 nm outward from the innermost sidewall of the antifuse element 14 that is in direct physical contact with the outer sidewall of the dielectric material structure 12. The opening 19 is formed utilizing lithography and etching.

Figure 6A:
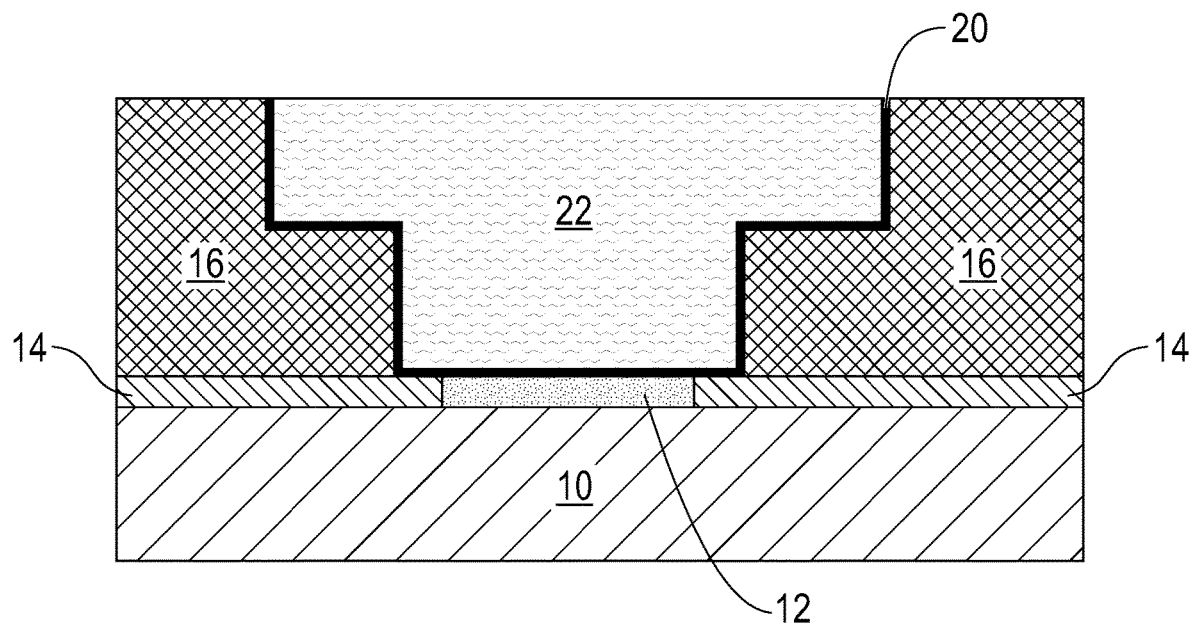
FIG. 6A is a cross sectional view of the exemplary antifuse structure of FIG. 5A after forming a second electrode in the lower via portion and the upper line portion of the opening.

Referring now to FIG. 6A, there is illustrated the exemplary antifuse structure of FIG. 5A after forming a second electrode 22 in the lower via portion and the upper line portion of the opening 18. In some embodiments and as shown in FIG. 6A, a diffusion barrier liner 20 may be formed within the opening 18 as well. In other embodiments, diffusion barrier liner 20 formation may be omitted.

In accordance with the illustrated embodiment, a diffusion barrier material is first formed into the opening 18 and on a physically exposed topmost surface of the interconnect dielectric material; the diffusion barrier material will provide the diffusion barrier liner 20 mentioned above. The diffusion barrier material may include Ta, TaN, Ti, TiN, Ru, RuN, RuTa, RuTaN, W, WN or any other material that can serve as a barrier to prevent a conductive material from diffusing there through. The thickness of the diffusion barrier material may vary depending on the deposition process used as well as the material employed. In some embodiments, the diffusion barrier material may have a thickness from 2 nm to 50 nm; although other thicknesses for the diffusion barrier material are contemplated and can be employed in the present application as long as the diffusion barrier material does not entirely fill the opening 18. The diffusion barrier material can be formed by a deposition process including, for example, CVD, PECVD, ALD, PVD, sputtering, chemical solution deposition or plating.

In some embodiments, an optional plating seed layer (not specifically shown) can be formed on the surface of the diffusion barrier material. In cases in which the conductive material to be subsequently and directly formed on the first diffusion barrier material, the optional plating seed layer is not needed. The optional plating seed layer is employed to selectively promote subsequent electroplating of a preselected electrically conductive metal or metal alloy. The optional plating seed layer may be composed of Cu, a Cu alloy, Ir, an Ir alloy, Ru, a Ru alloy (e.g., TaRu alloy) or any other suitable noble metal or noble metal alloy having a low metal-plating overpotential. Typically, Cu or a Cu alloy plating seed layer is employed, when a Cu metal is to be subsequently formed within the opening 18. The thickness of the optional plating seed layer may vary depending on the material of the optional plating seed layer as well as the technique used in forming the same. Typically, the optional plating seed layer has a thickness from 2 nm to 80 nm. The optional plating seed layer can be formed by a conventional deposition process including, for example, CVD, PECVD, ALD, or PVD.

An electrically conductive metal or metal alloy is formed into the opening 18 and, if present, atop the diffusion barrier material. The electrically conductive metal or metal alloy provides the second electrode 22 of the present application. The electrically conductive metal or metal alloy may be composed of one of the metal or metal alloys mentioned above for the first electrode 10. In some embodiments, the first and second electrodes (10, 22) are composed of a same electrically conductive metal or metal alloy. In other embodiments, the first and second electrodes (10, 22) are composed of a compositionally different electrically conductive metal or metal alloy. The electrically conductive metal or metal alloy that provides the second electrode 22 may be formed utilizing one of the deposition processes mentioned above in forming the first electrode 10 In some embodiments, the electrically conductive metal or metal alloy that provides the second electrode 22 is formed above the topmost surface of the interconnect dielectric material 16.

Following the deposition of the electrically conductive metal or metal alloy, and in some embodiments, a planarization process such as, for example, chemical mechanical polishing (CMP) and/or grinding, can be used to remove all portions of the electrically conductive metal or metal alloy (i.e., overburden material) that are present outside the opening 18 and atop the interconnect dielectric material 16 forming the second electrode 22. The planarization stops on a topmost surface of the interconnect dielectric material 16. If present, the planarization process also removes the diffusion barrier material from the topmost surface of the interconnect dielectric material 16. The remaining portion of the diffusion barrier material that is present in the opening 18 is referred to herein as the diffusion barrier liner 20, while the remaining electrically conductive metal or metal alloy that is present in the opening 18 may be referred to as the second electrode 22. The second electrode 22 may be referred to as a top electrode of the antifuse structure of the present application, while the first electrode 10 may be referred to as a bottom electrode of the antifuse structure of the present application.

As is shown, the second electrode 22 has a topmost surface that is coplanar with a topmost surface of the interconnect dielectric material 16, and if present, the topmost surfaces of the optional diffusion barrier liner 20.

Figure 6B:
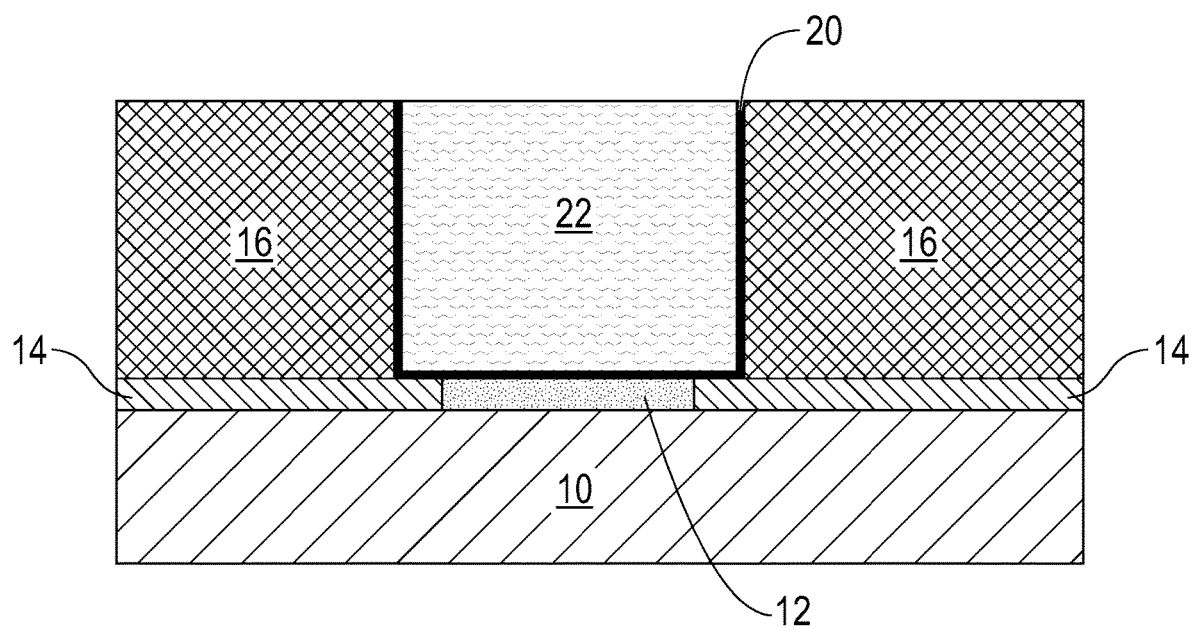
FIG. 6B is a cross sectional view of the exemplary antifuse structure of FIG. 5B after forming a second electrode the opening.

Referring now to FIG. 6B, there is illustrated the exemplary antifuse structure of FIG. 5B after forming a second electrode 22 in the opening 19. In some embodiments and as shown in FIG. 6B, a diffusion barrier liner 20 may be formed within the opening 19 as well. In other embodiments, diffusion barrier liner 20 formation may be omitted.

The optional diffusion barrier liner 20, and the second electrode 22 are composed of materials mentioned above in the embodiment depicted in FIG. 6A of the present application. Also, the optional diffusion barrier liner 20, and the second electrode 22 can be formed utilizing the processes details mentioned above for providing the exemplary antifuse structure shown in FIG. 6A.

In either embodiment (shown in FIGS. 6A and 6B), an antifuse structure in accordance with the present application is provided. The antifuse structure includes a dielectric material structure 12 composed of a dielectric material having a dielectric constant of greater than 4.0 located on a surface of a first electrode 10. An antifuse element 14 having a circular ring shape laterally surrounds, and directly contacts, the dielectric material structure 12. Thus, and in the present application, the dielectric material structure 12 is located in the center of the ring-shaped antifuse element 14. A second electrode 22 is located on an entirety of the dielectric material structure 12 and partially located on the antifuse element 14. Limited contact area between the ring-shaped antifuse element 14 and the first and second electrodes (10, 22) is provided by forming the dielectric material structure 12 within the center (i.e., hole) of the ring-shaped antifuse element 14. The limited contact area affords improved programming efficiency to the antifuse structure of the present application as compared to an antifuse structure in which a continuous antifuse element is located between the top and bottom electrodes.

While the present application has been particularly shown and described with respect to preferred embodiments thereof, it will be understood by those skilled in the art that the foregoing and other changes in forms and details may be made without departing from the spirit and scope of the present application. It is therefore intended that the present application not be limited to the exact forms and details described and illustrated, but fall within the scope of the appended claims.

What is claimed is:

1. An antifuse structure comprising:
   a dielectric material structure composed of a dielectric material having a dielectric constant of greater than 4.0 and located directly on a first electrode composed of an electrically conductive metal or metal alloy;
   an antifuse element having a circular ring shape that laterally surrounds, and directly contacts, the dielectric material structure, wherein the antifuse element is located directly on the first electrode; and
   a second electrode located on an entirety of the dielectric material structure and partially located on the antifuse material.

2. The antifuse structure of claim 1, wherein the dielectric material structure has a cylindrical shape.

3. The antifuse structure of claim 2, wherein the dielectric material structure has a dimension from 5 Å to 50 nm.

4. The antifuse structure of claim 1, wherein the dielectric material structure has a topmost surface that is coplanar with a topmost surface of the antifuse material.

5. The antifuse structure of claim 1, wherein the second electrode is embedded in an interconnect dielectric material.

6. The antifuse structure of claim 5, wherein the second electrode includes a lower via portion and an upper line portion.

7. The antifuse structure of claim 5, further comprising a diffusion barrier liner located on sidewall surfaces and a bottommost surface of the second electrode.

8. The antifuse structure of claim 5, wherein the second electrode has a topmost surface that is coplanar with a topmost surface of the interconnect dielectric material.

9. The antifuse structure of claim 1, wherein the antifuse element is composed of dielectric material that has a lower dielectric breakdown strength than the dielectric material that provides the dielectric material structure.

10. The antifuse structure of claim 9, wherein the dielectric material that provides the antifuse element has a dielectric constant of less than 3.5.

11. The antifuse structure of claim 10, wherein the dielectric material that provides the antifuse element is composed of a dielectric material including atoms of silicon, carbon and hydrogen, a dielectric material including atoms of silicon, carbon, hydrogen and oxygen, or a dielectric material including atoms of silicon, carbon, hydrogen and nitrogen.

* * * * *